United States Patent
Takata

(10) Patent No.: US 6,339,235 B1
(45) Date of Patent: Jan. 15, 2002

(54) SEMICONDUCTOR INTEGRATED CIRCUIT DEVICE HAVING A CLOCK NETWORK CAPABLE OF TRANSMITTING AN INTERNAL CLOCK SIGNAL WITH A REDUCED SKEW

(75) Inventor: Hidehiro Takata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 24 days.

(21) Appl. No.: 09/592,727

(22) Filed: Jun. 13, 2000

(30) Foreign Application Priority Data

Jun. 25, 1999 (JP) ............................................. 11-179685

(51) Int. Cl.[7] ................................................ H01L 27/10
(52) U.S. Cl. ......................... 257/208; 257/211; 257/777
(58) Field of Search ................................. 257/206, 207, 257/208, 211, 777

(56) References Cited

U.S. PATENT DOCUMENTS 5,446,410 A * 8/1995 Nakakura .................... 257/211
5,866,924 A * 2/1999 Zhu ............................. 257/208
5,892,250 A * 4/1999 Yoshida ....................... 257/208

FOREIGN PATENT DOCUMENTS

| JP | 4-48778 | * 2/1992 | .................. 257/208 |
| JP | 5-129433 | 5/1993 | |
| JP | 9-246503 | 9/1997 | |

* cited by examiner

Primary Examiner—Chandra Chaudhari
(74) Attorney, Agent, or Firm—McDermott, Will & Emery

(57) ABSTRACT

A clock driver formation region in which clock drivers are formed is disposed in a position overlapping, in a plan view, with a ring interconnection line and a mesh interconnection line extending over a semiconductor substrate region. An extra region dedicated to the clock driver formation region is not required, and the clock drivers are dispersed in a circuit device. Therefore, by adjusting drive capabilities of the clock drivers, a clock skew can be reduced, and electromagnetic noises during operation of the clock driver can be absorbed by interconnection lines at a higher layer.

13 Claims, 11 Drawing Sheets

MINIMUM SIZE IS EMPLOYED FOR MINIMUM DRAIN AREA.

SEMICONDUCTOR INTEGRATED CIRCUIT DEVICE HAVING A CLOCK NETWORK CAPABLE OF TRANSMITTING AN INTERNAL CLOCK SIGNAL WITH A REDUCED SKEW

BACKGROUND OF THE INVENTION

1. Field of the Invention

The present invention relates to semiconductor integrated circuit device, and particularly to a semiconductor integrated circuit device including a clock driver for supplying a clock signal to a clock network such as a clock mesh and a fish-bone. More particularly, the invention relates to a layout of clock drivers in a semiconductor integrated circuit device.

2. Description of the Background Art

A clock driver for supplying a clock signal to a clock network called, e.g., a clock mesh or a fish-bone in an LSI is required to have a large drive capability because such a clock network extends over the whole LSI, and have a large load capacitance of hundreds of picofarads. In accordance with increase in operation speed of the LSI (Large Scale Integrated Circuit), a clock frequency determining the operation speed of LSI has been increased above hundreds of megahertz to the order of gigahertz. For accurately performing operations in accordance with such an extremely short clock cycle, sever specifications are required with respect to rounding and skew of the clock signal (a severe ratio Tr/Tf of rising to falling times, and a skew value in the order of 100 ps). For satisfying the requirements for the clock signal, clock distribution scheme has been devised in various manners.

FIG. 17 schematically shows a whole structure of a fast LSI in the prior art. The fast LSI shown in FIG. 17 includes an instruction memory 100 including four memory blocks MB0–MB3, a predecoder 101a for predecoding instructions read from memory blocks MB0 and MB1 of instruction memory 100, a predecoder 101b for predecoding instructions read from memory blocks MB2 and MB3 of instruction memory 100, a decoder 102 for decoding the instructions predecoded by predecoders 101a and 101b, a data pass 109 for executing processing in accordance with the instructions decoded by decoder 102, an MU control circuit 103 for controlling an operation of a memory unit (MU) that is one of execution units, an IU control circuit 104 for controlling an operation of an instruction unit (IU) executing the instructions, a data memory 107 storing data, a variable-length coding/decoding circuit (VLC/VLD) 108 performing variable-length coding and variable-length decoding of the received data, a cyclic redundancy coding block (CRC) 106 detecting and correcting an error in the received data based on a cyclic redundant code, and a peripheral interface circuit 105 performing transmission of data to and from an external memory as well as input/output of signals from and to an external device.

Memory unit MU controls the transfer of data between the processing unit and peripheral circuit block 105.

This fast LSI further includes a phase locked loop circuit (PLL) 110 generating a clock signal, repeaters R0–R7 transferring the clock signal sent from PLL 110, and clock drivers C0–C6 receiving the clock signal transferred via repeaters R0–R7, to drive output nodes at high speed to perform fast transmission of the clock signal.

In this fast LSI, the clock signal generated from PLL 110 is once transferred to repeater R0 arranged in a central region, and then is transferred to repeaters R1 and R4 on the upper and lower sides of the central repeater R0. Repeaters R1 and R4 transmit the clock signal in the opposite directions. More specifically, repeater R1 transfers the clock signal to repeaters R2 and R3 arranged on its opposite sides, and repeater R4 transfers the clock signal to repeater R7 as well as repeaters R5 and R6 arranged on the side opposite to repeater R7. Repeater R7 also transfers the clock signal to clock drivers C4 and C6.

The clock signal is first transferred to the central portion, and then is distributed in all directions via the repeaters so that the clock signal is distributed through substantially equal transmission distance, intending to reduce a clock skew.

In this arrangement of clock drivers in the fast LSI shown in FIG. 17, the drive capabilities and positions of repeaters R0–R7 are selected to minimize the delay of the clock signal sent from PLL 110, so that the clock signal of a waveform having steep rising and falling is transmitted. Repeaters R0–R7 and clock drivers C0–C6 are dispersed on a chip, aiming to transfer fast clock signals without rounding its waveform and causing a skew.

FIG. 18 schematically shows another structure of a fast LSI in the prior art. In FIG. 18, a fast LSI 150 includes three operation (or arithmetic) blocks 150a, 150b and 150c arranged dispersedly, a clock driver 151 arranged between operation blocks 150a and 150b, and a clock driver 152 arranged between operation blocks 150a and 150b and operation block 150c. These clock drivers 151 and 152 are disposed in a T-shaped form. Operation blocks 150a–150c of fast LSI 150 are, e.g., floating-point arithmetic units (FPUs), respectively, and each execute floating-point arithmetic processing.

A gate array is disposed in a region including clock drivers 151 and 152, and arrangement of basic transistors in clock drivers 151 and 152 is performed in a master step. Drive capabilities of clock drivers 151 and 152 are adjusted by aluminum interconnection lines in a slice step. Thus, the drive capabilities of clock drivers 151 and 152 are adjusted in accordance with the structures of operation blocks 150a–150c, and optimized clock drivers can be achieved for implementing fast clock transfer.

In the fast LSIs shown in FIGS. 17 and 18, a position of a large region occupying about 3% of the whole LSI must be determined in advance for use by the clock drivers, in order to provide sufficiently large drive capabilities of clock drivers for reducing a clock skew. Particularly, in the case of the fast LSI shown in FIG. 18, the gate array can achieve the drive capability larger than a drive capability to be used actually, and an unnecessary large area is occupied. Therefore, the arrangement of the clock drivers lowers the flexibility of the floor plan of LSI, and increases a dead region which cannot be used. Therefore, the are increase exceeds the area increase which is required by the clock drivers, resulting in a problem that the chip area of fast LSI increases.

The positions of these clock drivers are fixedly determined so that inequality in length is present among interconnection lines of this clock network (due to increase in dead region), and ununiformed clock driving is present among the clock drives in the clock network. Thereby, the clock skew cannot be reduced sufficiently.

Accordingly, the fast LSIs shown in FIGS. 17 and 18 leave much room for improvement for reducing the clock skew on the clock network.

In the arrangements shown in FIGS. 17 and 18, if lay-out of the operation blocks and others is determined, arrangement of the clock drivers is fixed depending on the arrangement of the operation blocks. Therefore, there is no versatility in arrangement of the clock drivers.

SUMMARY OF THE INVENTION

An object of the invention is to provide a semiconductor integrated circuit device which allows easy adjustment of a drive capability without increasing an area.

Another object of the invention is to provide a semiconductor integrated circuit device having clock drivers with an optimum drive capability arranged regardless of internal circuit arrangement, to reduce a clock skew and noises of clock drivers.

A semiconductor integrated circuit device according to the invention has power supply interconnection lines arranged in a mesh form, and clock drivers are arranged covering all over a region under the power supply interconnection lines.

A clock driver formation region is arranged to overlap with a ring interconnection line and a meshed-shape interconnection line, which in turn are arranged over the whole surface on a semiconductor substrate region. Thus, the clock drivers can be arranged within the semiconductor substrate region without increasing an area occupied by the substrate. Since the clock drivers are disposed distributedly over the whole surface of the substrate, an optimum clock driver arrangement can be achieved by appropriately selecting the clock drivers in accordance with a layout of internal circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
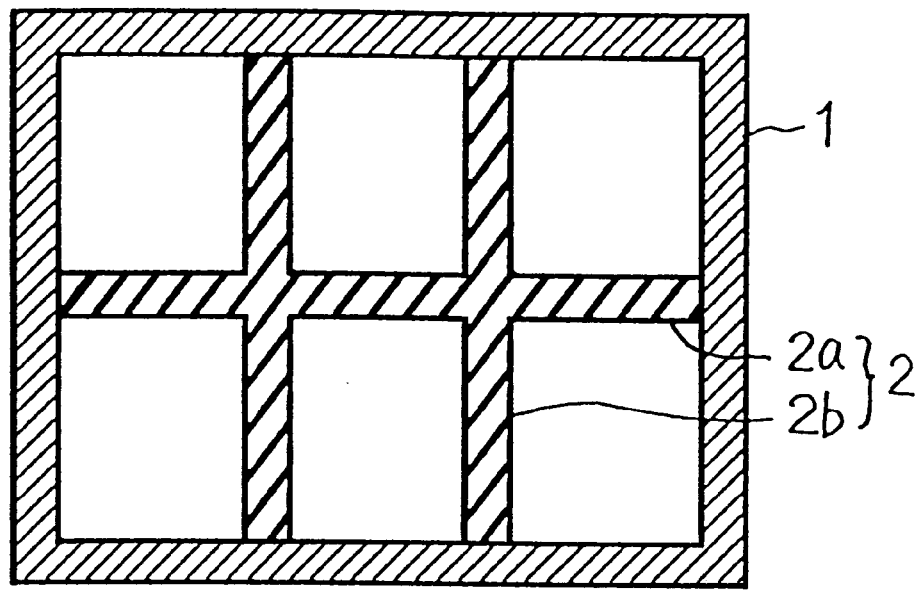
FIG. 1 schematically shows a power supply structure of a semiconductor circuit device according to the invention.

FIG. 1 schematically shows an interconnection layout of a semiconductor circuit device according to the invention. In FIG. 1, the semiconductor circuit device includes a ring interconnection line 1 which extends along a periphery of a rectangular semiconductor substrate and is arranged to form a closed loop, and a meshed-shape interconnection line 2 which extends over a region surrounded by ring interconnection line 1 and is connected to ring interconnection line 1. Meshed-shape interconnection line 2 includes interconnection lines 2a extending horizontally in FIG. 1 and interconnection lines 2b extending vertically in FIG. 1. Ring interconnection line 1 and meshed-shape interconnection 2 include at least a power supply line transmitting a power supply voltage Vcc and a ground line transmitting a ground voltage Vss. By arranging these power supply lines and ground lines in the mesh form on the semiconductor substrate region, the power supply voltage and the ground voltage can be supplied to internal circuits formed in the substrate region from the power supply lines and ground lines arranged in neighboring regions, and enhancement of the power supply can be achieved.

These ring interconnection line 1 and meshed-shape interconnection line 2 include clock signal lines transmitting clock signals, as necessary. If the clock signal lines are included in meshed-shape interconnection line 2 and ring interconnection line 1, the internal circuit can be stably supplied with the clock signal from a neighboring clock signal line so that rounding of the clock signal, a clock skew and others can be suppressed.

Each of ring interconnection line 1 and meshed-shape interconnection line 2 has a line width ten or more times larger than a normal line width so that necessary voltages and signals may be stably supplied to the internal circuits, and resistances of the interconnection lines may be reduced. Accordingly, these ring and meshed-shape interconnection lines 1 and 2 require a large interconnection region, and are disposed in an interconnection layer at an upper layer in a multi-layer interconnection process.

Figure 2:
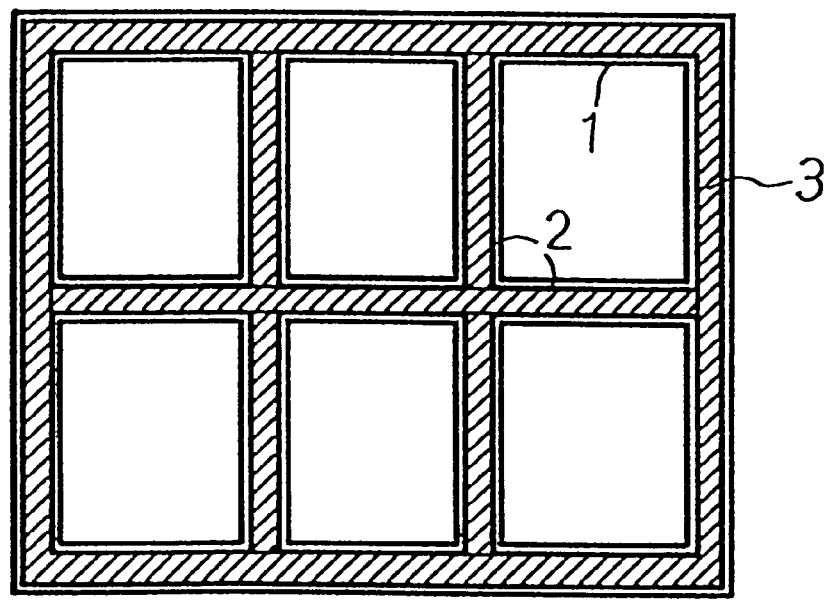
FIG. 2 schematically shows a clock driver formation region according to a first embodiment of the invention.

FIG. 2 schematically shows an arrangement of clock drivers according to a first embodiment of the invention. In a plan view of FIG. 2, a clock driver formation region 3 overlaps with a region where ring and meshed-shape interconnection lines 1 and 2 are disposed. The clock drivers formed in clock driver formation region 3 are disposed substantially all over clock driver formation region 3. In accordance with a required drive capability, only required clock drivers are operated by connecting their input and output nodes to clock signal lines. Unrequired clock drivers are disabled by connecting their input nodes to the power supply line or ground lines, and setting their output nodes to an open state. Thus, the drive capability of a clock driver is adjusted.

More specifically, in the case where the clock driver is formed of a plurality of cascaded inverters, the number of inverters which are actually used is adjusted in accordance with the drive capability required to the clock driver. Alternatively, the drive capability of the transistors forming each inverter may be adjusted. The transistors forming the above described inverters are disposed carpeting substantially all over clock driver formation region 3, and only the required transistors are used.

Figure 3:
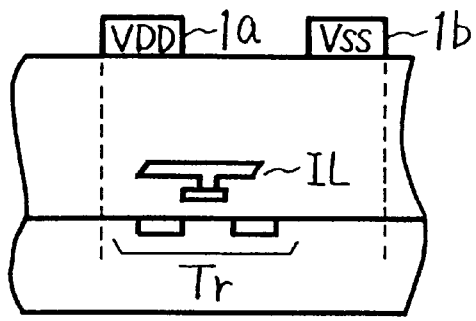
FIG. 3 schematically shows a relationship in arrangement between clock drivers and a power supply in the first embodiment of the invention.

FIG. 3 schematically shows a sectional structure of a semiconductor circuit device according to the first embodiment of the invention. In FIG. 3, ring interconnection line 1 or meshed-shape interconnection line 2 includes a power supply line 1a and a ground line 1b, formed at a layer higher than an interconnection layer for forming the clock drivers, for transmitting power supply voltage Vcc and ground voltage Vss. Under a region in which ring interconnection line 1 or meshed-shape interconnection line 2 is formed, a transistor Tr for forming a clock driver is formed so that transistor Tr may overlap with this region in a plan view. Transistor Tr is formed of an insulated gate field effect transistor (referred to as an "MOS transistor" hereinafter), and has a gate connected to an internal interconnection line IL. Internal interconnection line IL is disposed in an interconnection layer lower than a layer for ring and meshed-shape interconnection lines 1 and 2, and short circuit or butting between internal interconnection line IL and ring or meshed-shape interconnection line 1 or 2 does not occur. In clock driver formation region 3, therefore, the transistors can be formed without any influence by meshed-shape interconnection line 2 and ring interconnection line 1, and these transistors can be interconnected to form the clock driver and to make a connection to another circuit.

For example, a PLL circuit or the like supplies an internal clock signal to the clock drive circuit in a central portion, and then the internal clock signal is distributed and transmitted in all the directions.

According to the first embodiment of the invention, as described above, the clock driver formation region is disposed to overlap, in a plan view, with the ring and meshed-shape interconnection lines disposed on the semiconductor substrate region, and the transistors forming the clock drivers are disposed carpeting substantially all over the clock driver formation region. Therefore, the clock drivers can be formed without exerting any adverse effect on the layout of the internal circuits formed in the semiconductor substrate region. Since the clock drivers are arranged dispersedly in the semiconductor substrate region, the clock signal can be transmitted fast to any internal circuit. Owing to dispersion of the clock drivers in the semiconductor substrate region, the layout of internal circuits can be determined without giving consideration to the positions of the clock drivers, and the clock drivers can be appropriately disposed in accordance with the layout of the internal circuits so that flexibility in circuit layout can be remarkably improved.

Electromagnetic radiation noises upon operation of the clock driver can be absorbed by the power supply line and ground line at the upper layer.

The drive capability of the clock driver formed in clock driver formation region 3 can be easily adjusted by appropriately selecting the transistors formed therein.

[Second Embodiment]

Figure 4:
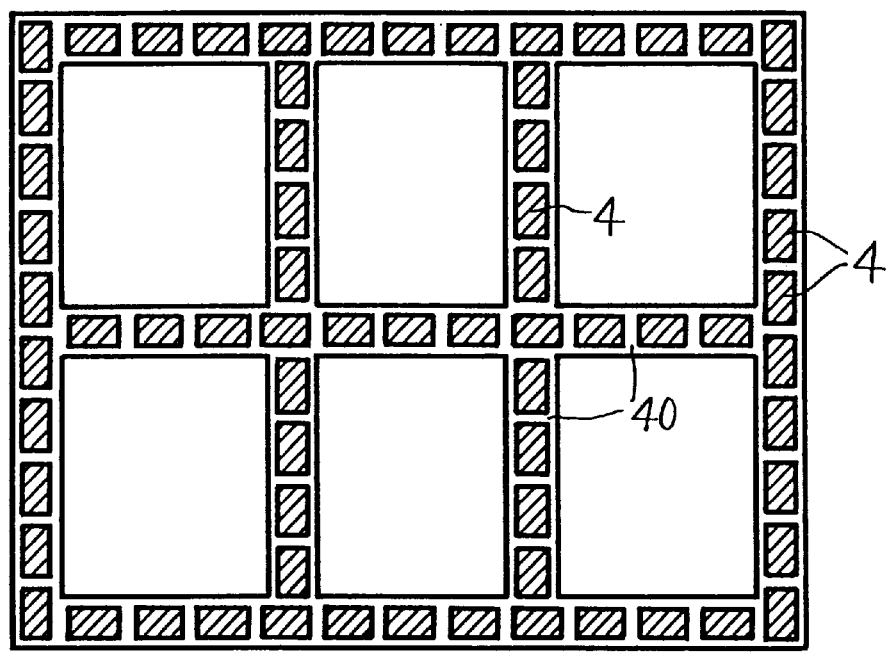
FIG. 4 schematically shows a whole structure of a semiconductor circuit device according to a second embodiment of the invention.

FIG. 4 schematically shows a structure of a semiconductor circuit device according to a second embodiment of the invention. In the structure shown in FIG. 4, the clock driver formation region is divided into clock driver sub-blocks 4 by feed-through regions 40 for passing therethrough the interconnection lines disposed across the ring and meshed-shape interconnection lines. The clock drivers are formed in the clock driver sub-blocks 4. If a large clock driver is formed, a large delay would occur in the clock driver because drive circuit stages would increase in number. Owing to division into clock driver sub-blocks 4, the number of the drive circuit stages formed in clock driver sub-block 4 can be reduced, and the delay time thereof can be reduced, so that the delay in the clock driver can be reduced.

If interconnection lines for interconnecting the components of the clock driver are complicated with interconnection lines for connection to an internal circuit or another circuit, noises due to the operation of the clock driver would be transferred onto the interconnection line connected to another circuit, and would adversely affect the operation of another circuit. By providing feed-through regions 40 for separating the interconnection line to another circuit from the interconnection lines of the clock driver, the complication of the interconnection lines can be prevented, and it is possible to prevent the noises caused by the operation of the clock driver from adversely affecting the operation of another circuit.

Owing to provision of feed-through regions 40, the clock drive circuits can be disposed in clock driver sub-blocks 4 with a sufficient margin and without giving consideration to the layout of other circuit interconnection lines.

[Third Embodiment]

Figure 5:
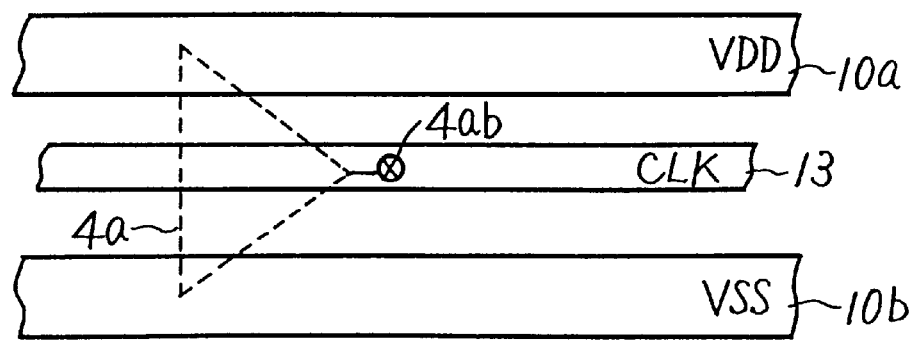
FIG. 5 schematically shows a structure of a main portion of a semiconductor circuit device according to a third embodiment of the invention.

FIG. 5 schematically shows a structure of a semiconductor circuit device according to a third embodiment of the invention. In FIG. 5, a power supply line 10a transmitting a power supply voltage VDD and a ground line 10b transmitting a ground voltage VSS are disposed in the same layer and in parallel with each other. A clock output line 13 transmitting the output signal of clock drive circuit 4a is disposed between power supply line 10a and ground line 10b. Clock output line 13 is formed in the same layer as power supply line 10a and ground line 10b, and is disposed between them. Clock drive circuit 4a may be a drive circuit formed in clock driver sub-block 4, or may be a clock driver formed in clock driver formation region 3.

Power supply line 10a and ground line 10b may be included in either of ring interconnection line 1 and meshed-shape interconnection line 2, but clock drive circuit 4a is formed below these lines. Power supply line 10a and ground line 10b transmit fixed voltages, respectively. Therefore, in the structure wherein clock output line 13 is disposed between power supply line 10a and ground line 10b, power supply line 10a and ground line 10b function as an electrostatic shield layer to prevent the changes in signal on clock output line 13 from producing noises adversely affecting other circuits.

Clock output line 13 is coupled at its appropriate position to a corresponding circuit for transmitting the clock signal to the corresponding circuit, and is connected, e.g., to a clock input line of the corresponding circuit in the feed-through region.

According to the third embodiment of the invention as described above, the clock output line transmitting the output clock of the clock drive circuit is disposed between the power supply line and the ground line included in the ring interconnection line or meshed-shape interconnection line. Therefore, the power supply line and the ground line function as an electrostatic shield layer against the clock output line, and can prevent noises due to the clock signal from being transmitted to another circuit through capacitive coupling to cause malfunction of another circuit.

[Fourth Embodiment]

Figure 6A:
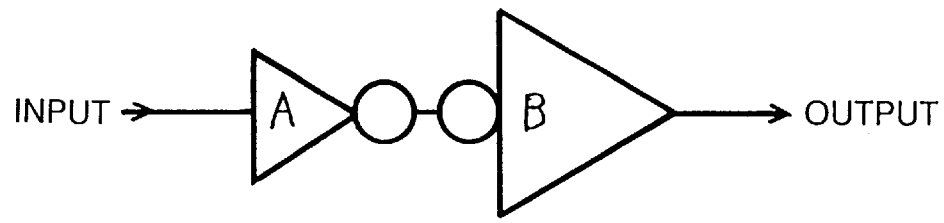
FIG. 6A schematically shows a structure of a clock drive circuit according to a fourth embodiment of the invention.
Figure 6B:
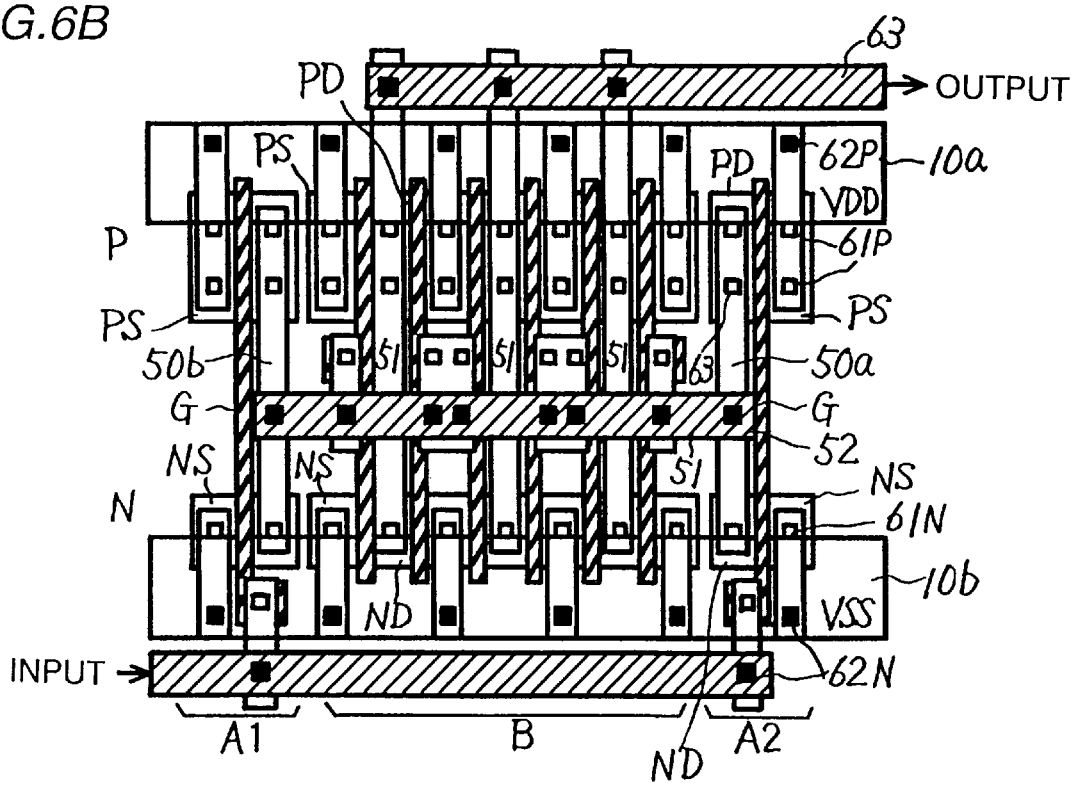
FIG. 6B shows a planar layout thereof.
Figure 6C:
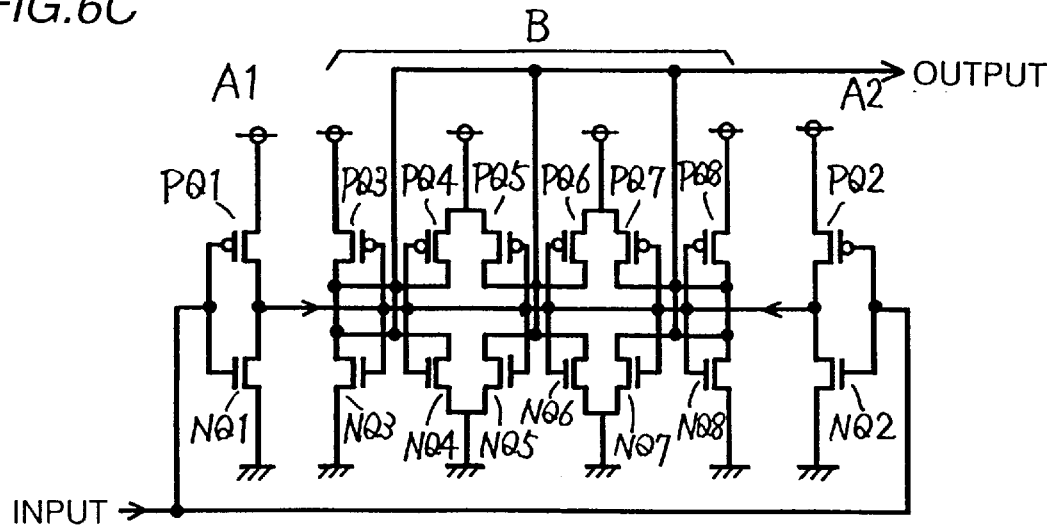
FIG. 6C shows an electrical equivalent circuit of the structure in FIG. 6A.

FIGS. 6A–6C schematically show a structure of a clock driver according to a fourth embodiment of the invention. As shown in FIG. 6A, a clock drive circuit formed in clock driver sub-block 4 is formed of two cascaded inverters A and B. Inverter A in the input stage has a small size and a small input impedance. Inverter B in the output stage has a large size and a small output impedance, and drives a load of a subsequent stage at high speed.

A predetermined number of clock drive circuits each having a structure shown in FIG. 6A are connected to form a clock driver. Accordingly, signal transmission delay can be reduced as compared with a clock driver formed of cascaded inverters having successively increased sizes, respectively.

FIG. 6B schematically shows a planar layout of the clock drive circuit according to the fourth embodiment of the invention. In FIG. 6B, a region for forming P-channel MOS transistors is arranged under power supply line 10a transmitting power supply voltage VDD, and a region for forming N-channel MOS transistors is arranged under ground line 10b transmitting ground voltage VSS. These power supply line 10a and ground line 10b are formed, e.g., in a second level aluminum interconnection layer.

Inverter A in an input stage is divided into two CMOS inverter circuits. More specifically, as shown in FIG. 6B, two CMOS inverter circuits A1 and A2 are disposed on the opposite sides of output inverter B. In CMOS inverter circuits A1 and A2, a source region PS of each P-channel MOS transistor is connected to a first level aluminum interconnection line (i.e., an intermediate layer) via a contact hole 61P. The first level aluminum interconnection line at the intermediate layer is connected to power supply line 10a via a contact hole 62P. A source region NS of the N-channel MOS transistor is connected to another first level aluminum interconnection line via contact hole 61N. The another first level aluminum interconnection line is connected to ground line 10b via contact hole 62N. In each of CMOS inverter circuits A1 and A2, drain regions are mutually connected by first level aluminum interconnection line 50a or 50b.

Inverter B in the output stage, which is formed between two CMOS inverter circuits A1 and A2, is likewise formed of a CMOS inverter circuit. In output inverter B, source regions PS and drain regions PD of P-channel MOS transistors are disposed alternately to each other. Source regions PS of P-channel MOS transistors are connected to a power supply line 10a. Likewise, source regions NS and drain regions ND of N-channel MOS transistors in output inverter B are disposed alternately to each other. Source region NS is connected to ground line 10b. Drain regions PD of the P-channel MOS transistors are connected to drain regions ND of the N-channel MOS transistors by first level aluminum interconnection lines 51, respectively. A gate electrode layer (line) G is disposed between these source regions and drain regions for forming gate electrodes of corresponding MOS transistors. Drain regions PD of input inverter circuits A1 and A2 are connected by second level aluminum interconnection line 52 to the gate electrode layer of output inverter B via contact holes. Interconnection line 52 is in the second level aluminum interconnection layer, and gate electrode layer G is a first level polycrystalline silicon layer. Therefore, the first level aluminum interconnection line is present between the gate electrodes of output inverter B and interconnection line 52 for connecting them together.

Interconnection line 51 is connected to an output interconnection line 63, which in turn is disposed outside power supply line 10a and is formed in the second level aluminum interconnection layer, and gate electrodes G for the MOS transistors of input inverter circuits A1 and A2 are connected to an input line 62 that is formed of the second level aluminum interconnection layer and is disposed outside ground line 10b.

FIG. 6C shows an electrical equivalent circuit of the clock drive circuit shown in FIG. 6B. As shown in FIG. 6C, MOS transistors forming output inverter B are disposed between CMOS inverter circuits A1 and A2. CMOS inverter circuit A1 is formed of MOS transistors PQ1 and NQ1, and CMOS inverter circuit A2 is formed of MOS transistors PQ2 and NQ2. Each of MOS transistors PQ1, PQ2, NQ1 and NQ2 receives on its gate the input clock signal.

Output inverter B includes P-channel MOS transistors PQ3–PQ8 arranged in parallel with each other, as well as N-channel MOS transistors NQ3–NQ8 arranged corresponding to MOS transistors PQ3–PQ8, respectively. MOS transistors PQ3–PQ8 form transistor pairs, with each pair formed of MOS transistors adjacent to each other and having drains connected to the output line via a common contact hole. Likewise, MOS transistors NQ3–NQ8 form transistor pairs, with each pair formed of MOS transistors adjacent to each other and having drains connected to the output line via a common contact hole. These MOS transistors PQ3–PQ8 and NQ3–NQ8 are supplied on their gates with the output signals of CMOS inverter circuits A1 and A2.

CMOS inverter circuits A1 and A2 on the opposite sides of output inverter B drive the gates of the CMOS inverter circuits included in output inverter B. Therefore, the output signals of input inverter A (A1 and A2) are transmitted fast to the input portion of output inverter B, and the output clock signal can be produced fast in accordance with the input clock signal without signal transmission delay. The gates of CMOS inverter circuits (MOS transistors PQ3–PQ8 and NQ3–NQ8) of the output inverter B are driven by the output signals of CMOS inverter circuits A1 and A2 arranged on the opposite sides of output inverter B, and therefore the input signals reach the CMOS inverter circuits of output inverter B at the same time so that the output line is driven substantially at the same timing, and the output clock signal is produced fast.

Accordingly, the clock drive circuit capable of fast operation is implemented so that a signal delay (gate delay) in the clock driver can be reduced, and the clock signal with a reduced skew can be transmitted.

[Fifth Embodiment]

Figure 7A:
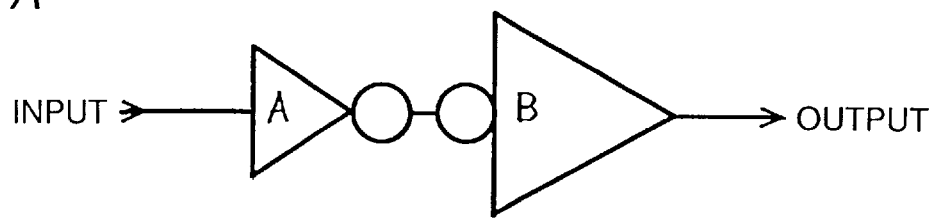
FIG. 7A shows a structure of a clock drive circuit according to a fifth embodiment of the invention.
Figure 7B:
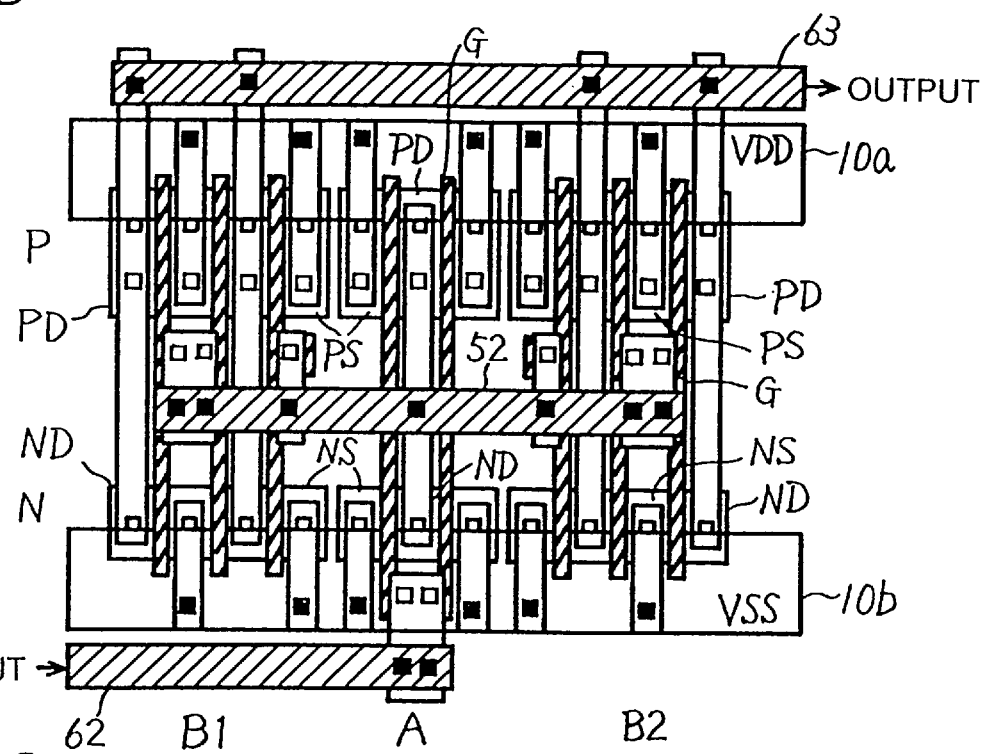
FIG. 7B shows a planar layout of the clock drive circuit according to the fifth embodiment of the invention.
Figure 7C:
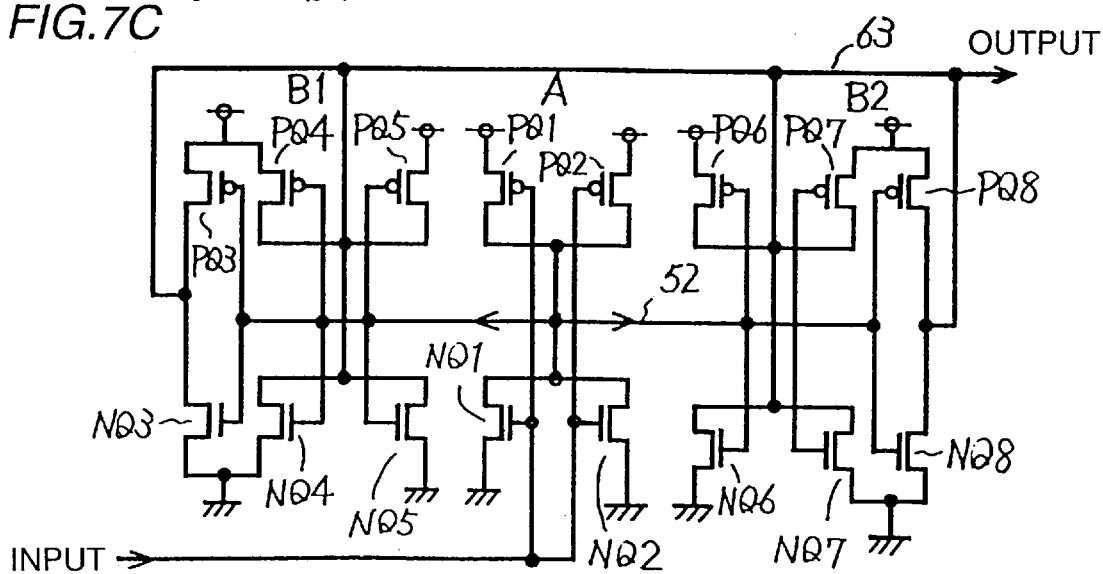
FIG. 7C shows an electrical equivalent circuit of the clock drive circuit shown in FIG. 7B.

FIGS. 7A–7C show a structure of a clock driver according to a fifth embodiment of the invention. As shown in FIG. 7A, clock driver sub-block 4 in this fifth embodiment is likewise formed of two inverter circuits A and B having different drive capabilities from each other.

FIG. 7B schematically shows a planar layout of the clock drive circuit according to the fifth embodiment of the invention. In this fifth embodiment, power supply line 10a and ground line 10b are arranged parallel to each other, a P-channel MOS transistor formation region P is arranged under power supply line 10a, and an N-channel MOS transistor formation region N is arranged under ground line 10b. Output inverter B is divided into two CMOS inverter circuits B1 and B2, and input inverter A is disposed in a central portion between CMOS inverter circuits B1 and B2. Gate electrode G of input inverter A is coupled to clock input line 62, which in turn is formed in the second level aluminum layer for transmitting the input signal, via a contact hole and a through-hole. Similarly to FIG. 6B, blank squares in FIG. 7B represent contacts of the first level aluminum interconnection lines with source/drain or gate electrode layers, and solid black squares represent through-holes for connection between the first and second level aluminum interconnection lines.

In input inverter A source region PS of P-channel MOS transistor is connected to power supply line 10a, and source region NS of the N-channel MOS transistor is connected to ground line 10b. Drain regions PD and ND of MOS transistors PD and ND in input inverter A are electrically connected to interconnection line 52 formed in the second level aluminum interconnection layer.

Each of inverter circuits B1 and B2 has a structure of a CMOS inverter circuit. In P-channel MOS transistor formation region P, drain regions PD and source regions PS are arranged alternately to each other, and each of source regions PS and drain regions PD is shared between adjacent two MOS transistors. Likewise, in N-channel MOS transistor formation region N, drain regions ND and source regions NS are arranged alternately to each other, and each of drain regions ND and source regions NS is shared between adjacent two MOS transistors.

Drain regions PD and ND of the MOS transistors in output CMOS inverter circuits B1 and B2 are electrically connected to output line 63. Interconnection line 52 is electrically connected to gate electrodes G of the MOS transistors in output CMOS inverter circuits B1 and B2.

The output signal of input inverter A arranged in the central portion is transmitted via interconnection line 52 to output CMOS inverter circuits B1 and B2 arranged on the opposite sides.

FIG. 7C shows an electrical equivalent circuit of the clock drive circuit shown in FIG. 7B. As shown in FIG. 7C, input inverter A is formed of two P-channel MOS transistors PQ1 and PQ2 as well as two N-channel MOS transistors NQ1 and NQ2.

Output CMOS inverter circuit B1 is formed of three P-channel MOS transistors PQ3–PQ5 as well as three N-channel MOS transistors NQ3–NQ5. Output CMOS inverter circuit B2 is formed of three P-channel MOS transistors PQ6–PQ8 as well as three N-channel MOS transistors NQ6–NQ8.

The output signal of input inverter A is transmitted in the opposite directions to output CMOS inverter circuits B1 and B2. Therefore, the output signal of input inverter A reaches output CMOS inverter circuits B1 and B2 at the same time, and CMOS inverter circuits B1 and B2 operate at substantially at the same timing to drive clock output line 63. Input inverter A is disposed in a central portion of output inverter B (B1 and B2), and the output signal of input inverter A is transmitted to output CMOS inverter circuits B1 and B2 through short distances and therefore with small signal transmission delays. Accordingly, the signal delay in the clock drive circuit can be small, and the clock drive circuit capable of fast operation can be achieved.

As described above, the output inverter circuit is bi-divided, and the input inverter is arranged in the central portion between the divided circuits. Therefore, the signal transmission distance of the input inverter can be short, and the distances over which the input signal is transmitted to the output inverters can be made equal to each other. Therefore, signal transmission delay (gate delay) in the clock driver can be reduced, and the clock drive circuit capable of fast operation can be achieved.

[Sixth Embodiment]

Figure 8A:
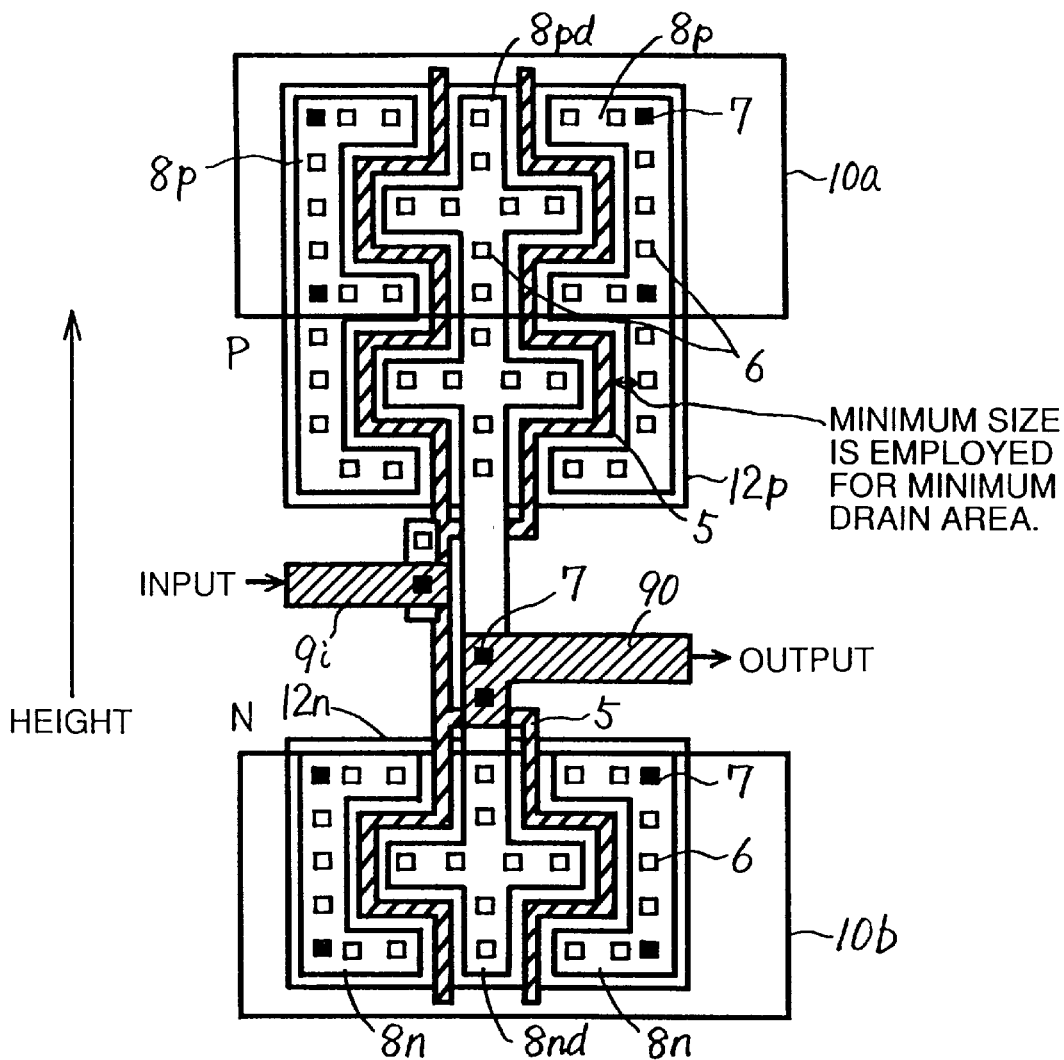
FIG. 8A schematically shows a planar layout of a clock drive circuit according to a sixth embodiment of the invention.

FIG. 8A shows an example of a structure of a clock drive circuit according to a sixth embodiment of the invention. In FIG. 8A, a CMOS inverter forming a clock drive circuit is disposed between power supply line 10a and ground line 10b. Since it is necessary to dispose the clock drive circuit within a region between power supply line 10a and ground line 10b, a restriction is imposed on a structure in the direction of the height (i.e., size from the power supply line to the ground line) of this clock drive circuit. The clock drive circuit formation region has a smaller width than the meshed-shape/ring interconnection line arranged region. MOS transistor must have a large channel width for increasing its current drive capability. In the layout shown in FIGS. 6B and 7B, the MOS transistors forming the drive circuit are connected in parallel so that the channel width is equivalently increased, and the current drive capability is increased.

In the structure shown in FIG. 8A, the effective channel width of the transistor can be made sufficiently large, and the drain capacitance can be reduced even under constraints in the height direction.

In FIG. 8A, P-channel MOS transistors are formed in a transistor field region 8p, and N-channel MOS transistors are formed in a transistor field region 12n formed under ground line 10b. Source regions in transistor field region 12p are formed into a comb shape, and are electrically connected via contact holes 6 to an upper first level aluminum interconnection layer 8p, which is formed into a comb shape. First level aluminum interconnection layer 8p is electrically connected to power supply line 10a via through-hole 7.

In the central portion of transistor field region 12p, a drain region is formed in the form of a nearly patriarchal cross, engaging with comb-shaped source region. On this drain region, there is arranged a first level aluminum interconnection line 8d similarly formed into a nearly patriarchal cross shape. The drain region is electrically connected to first level aluminum interconnection line 8d via contact holes 6.

Gate electrode layer 5 having a nearly zigzag form is arranged between the drain and source regions. Gate electrode layer 5 is electrically connected to a clock input line 9i. In transistor field region 12n, a source region having a nearly U-shaped form is likewise formed, and is electrically connected to a first level aluminum interconnection line 8n having a nearly U-shaped form via contact holes 6. A drain region of a cross form is formed in a central portion of transistor field region 12n. A first level aluminum interconnection line 8nd of a cross form is formed on the drain region. Gate electrode layer 5 having concave and convex portions is disposed between the drain and source regions, and is connected to a clock input line 9i.

First level aluminum interconnection lines 8pd and 8nd forming the drain electrodes are electrically connected to a clock output line 9o via through-holes 7. Clock input line 9i and clock output line 9o are formed in the second level aluminum interconnection layer.

By arranging gate electrode 5 which is bent substantially into a zigzag form in a plan view, the P- and N-channel MOS transistors can have longer gates, and therefore large channel widths W. Thereby, the MOS transistors having a sufficiently large current drive capability can be obtained even under constrains due to the pitch of power supply line 10a and ground line 10b in the height direction of the clock driver.

The allowable minimum value according to the design rules is used for a region between gate electrode layer 5 and drain contact 6. Thereby, the drain area of the MOS transistor is reduced, and the drain capacitance caused by drain junction capacitance is reduced so that fast output of the output signal can be performed.

Figure 8B:
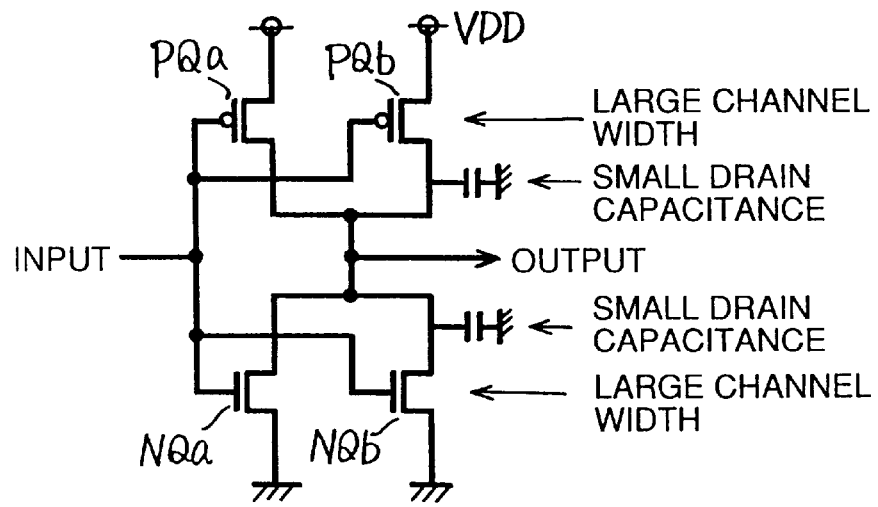
FIG. 8B shows an electrical equivalent circuit of the planar layout shown in FIG. 8A.

FIG. 8B shows an electrical equivalent circuit of the clock drive circuit shown in FIG. 8A. P-channel MOS transistors PQa and PQb are formed in transistor field region 12p, and N-channel MOS transistors NQa and NQb are formed in transistor field region 12n. The gates of these MOS transistors PQa, PQb, NQa and NQb have a zigzag form (or a comblike form) shown in FIG. 8A in the height direction so that the channel widths thereof may increase. Further, the drain areas are minimized for reducing the drain capacitances, to reduce a parasitic capacitance connected to clock output line 9o, and the output signal is driven fast.

According to the sixth embodiment of the invention, as described above, since the gate electrode layer is bent into a meandering form, the channel widths of MOS transistors can be equivalently increased so that the current drive capabilities can be large. Further, the drain contact and the gate electrode layer are spaced from each other by the allowable minimum design size for reducing the drain area. Thereby, the output parasitic capacitance due to the drain capacitance is reduced so that the output signal can be driven fast.

[Seventh Embodiment]

Figure 9:
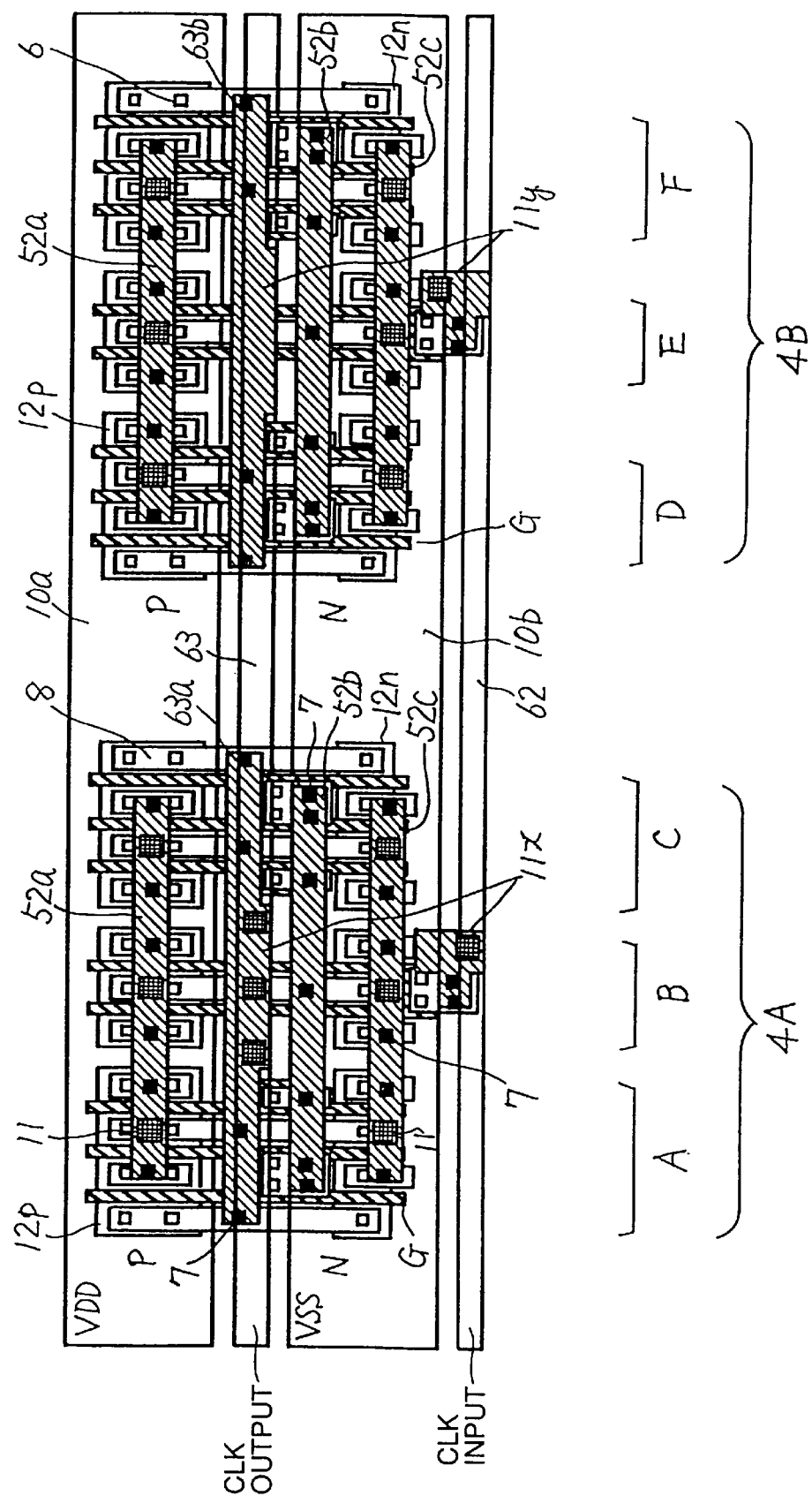
FIG. 9 schematically shows a planar layout of a clock drive circuit according to a seventh embodiment of the invention.

FIG. 9 schematically shows a planar layout of a semiconductor circuit device according to a seventh embodiment of the invention. FIG. 9 shows two clock driver sub-blocks 4A and 4B. Power supply line 10a and ground line 10b are arranged commonly to clock driver sub-blocks 4A and 4B. An output clock line 63 for transmitting the clock signal is disposed between power supply line 10a and ground line 10b. Similarly to the structure of the second embodiment, output clock line 63 is electrostatically shielded by power supply line 10a and ground line 10b, for preventing generation of noises. Output clock line 63 is included in the ring or meshed-shape interconnection line. Power supply line 10a, output clock interconnection line 63 and ground line 10b in the present embodiment are formed in a third level aluminum interconnection layer. Clock input line 62 for transmitting the clock signal is disposed outside and in parallel with ground line 10b. Clock input line 62 is likewise formed in the third level aluminum interconnection layer. The clock driver sub-blocks are substantially covered with power supply line 10a and ground line 10b except for a region between them.

In clock driver sub-block 4A, three transistor fields 12p are disposed under power supply line 10a, for forming P-channel MOS transistors, and three transistor fields 12n are disposed under ground line 10b, for forming N-channel MOS transistors. The P-channel MOS transistors formed in transistor fields 12p have source regions commonly connected to a sub-power supply line 52a formed in the second level aluminum interconnection layer. Sub-power supply line 52a overlaps with power supply line 10a, and is electrically connected to power supply line 10a via through-hole 11. Source regions formed in transistor fields 12p are commonly connected to first level aluminum interconnection layer 8, and is connected via through-hole 7 to a sub-output block line 63a disposed under clock output line 63.

In transistor fields 12n forming N-channel MOS transistors, the source regions are connected to a sub-ground line 52c formed in the second level aluminum interconnection layer via through-holes 7. Sub-ground line 52c formed in the second level aluminum interconnection layer is connected to ground line 10b via through-holes 11. The drain region in transistor field 12n is connected to the first level aluminum interconnection layer 8, which in turn is connected to sub-output clock line 63a via through-hole 7.

Clock driver sub-block 4A is actually used, and therefore sub-clock output line 63a is electrically connected to clock output line 63 via through-holes 11x. Likewise, clock input line 62 is electrically connected via through-holes 11x to gate electrode layers G of transistors formed in transistor fields 12p and 12n on the opposite sides of the central portion. The transistors (drive circuit) B provided in central portion form the input drive circuit, and drive circuits A and C on the opposite sides thereof form the output drive circuits.

Clock driver sub-block 4B is a clock drive region which is not used. In clock driver sub-block 4B, transistors 12p and 12n are disposed in accordance with a layout similar to that in clock driver sub-block 4A, and also gate electrodes G, the source regions and the drain regions are mutually connected. However, this sub-block is not used. Therefore, sub-output clock line 63b is not connected to clock output line 63 although sub-output clock line 63b is connected to the output nodes of drive circuits D and F formed in the same region. More specifically, through-hole 11x for connection between the sub-output clock line 63b and clock output line 63 is not provided. In input drive circuit E, the gate electrode is electrically connected to ground line 10b via a through-hole 11y. Therefore, clock driver sub-block 4B not used has the input fixed to the ground voltage level and the output in the open state. Thereby, the number of the clock drive circuits to be used is adjusted, and the drive capability of the clock driver is adjusted.

In clock driver sub-blocks 4A and 4B, the transistors and the interconnection lines are arranged in accordance with the same layout. There is only a difference in position of the through-holes with respect to clock input line 12 and clock output line 63. Accordingly, all the clock driver sub-blocks are formed in a master step, and clock output line 63 and clock input line 62 are formed in a slice step after adjusting positions of the through-holes. Thereby, a clock drive circuit having an optimum drive capability can be achieved in accordance with its application, and the clock skew can be reduced.

Figure 10:
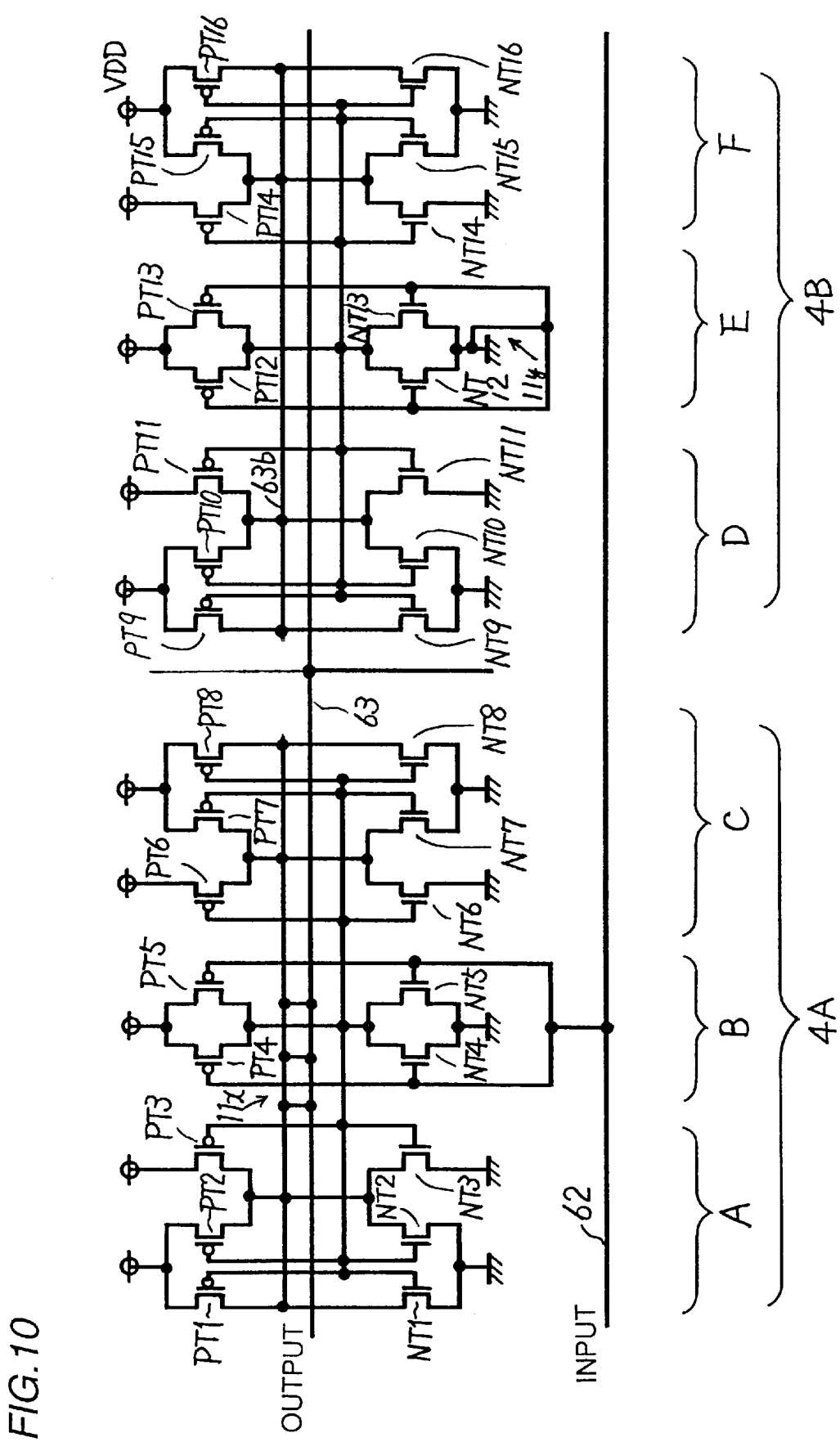
FIG. 10 shows an electrical equivalent circuit of the clock drive circuit shown in FIG. 9.

FIG. 10 shows an electrically equivalent circuit of clock driver sub-blocks 4A and 4B shown in FIG. 9. In clock driver sub-block 4A shown in FIG. 10, input clock drive circuit B is formed of CMOS inverters, and includes P-channel MOS transistors PT4 and PT5 as well as N-channel MOS transistors NT4 and NT5. Gates of MOS transistors PT4, PT5, NT4 and NT5 are coupled to clock input line 62.

Output clock drive circuit A is formed of CMOS inverters, and includes P-channel MOS transistors PT1–PT3 and N-channel MOS transistors NT1–NT3. These MOS transistors PT1–PT3 and NT1–NT3 are supplied on their gates with the output signal of input clock drive circuit B. The output nodes (drain regions) of MOS transistors PT1–PT3 and NT1–NT3 are coupled to clock output line 63 via through-holes 11x.

Output clock drive circuit C is formed of CMOS inverters, and includes P-channel MOS transistors PT6–PT8 and N-channel MOS transistors NT6–NT8. MOS transistors PT6–PT8 and NT6–NT8 are commonly supplied on their gates with the output signal of input clock chive circuit B. The drain regions of MOS transistors PT6–PT8 and NT6–NT8 are commonly coupled to clock output line 63 via through-holes 11x.

Similarly to clock driver sub-block 4A, non-used clock driver sub-block 4B (i.e., clock driver sub-block not to be used) includes input clock drive circuit E as well as output clock drive circuits D and F arranged on the opposite sides of clock drive circuit E. Input clock drive circuit E includes two P-channel MOS transistors PT12 and PT13 as well as two N-channel MOS transistors NT12 and NT13. Output clock drive circuit D includes three P-channel MOS transistors PT9–PT11 and three N-channel MOS transistors NT9–NT11. The other clock drive circuit E includes three P-channel MOS transistors PT14–PT16 and three N-channel MOS transistors NT14–NT16.

The foregoing layout of the transistors is similar to those in clock driver sub-blocks 4A and 4b already described with reference to FIG. 9. In clock driver sub-block 4B not to be used, however, the gates of MOS transistors PT12, PT13, NT12 and NT13 in input clock drive circuit E are coupled to the ground node via through-holes 11y. The output nodes of output clock drive circuits D and F are commonly coupled to the internal interconnection line, but this internal interconnection line (sub-output clock line 63b) is not coupled to clock output line 63, and is kept in the open state. The clock output line 63 may be configured to transmit the clock signal to an internal circuit via appropriate interconnection lines disposed between sub-blocks 4A and 4B.

As can be seen from the electrical equivalent circuit shown in FIG. 10, the clock drive circuit can be set to the use/non-use state merely by changing the positions of the through-holes provided for connection between the second and third level aluminum interconnection layers. Depending on the intended use, therefore, the drive capability of the clock driver can be easily adjusted.

In the structures shown in FIGS. 9 and 10, clock input line 62 is adjacent to ground line 10b. If clock input line 62 is adjacent to power supply line 10a, clock driver sub-block 4B not to be used may have the input node (gate) of the input drive circuit fixed to the power supply voltage level. The output node is kept in the open state.

According to the seventh embodiment of the invention, as described above, the positions of the through-holes for connecting the second and third level aluminum interconnection layers can be changed, and the power supply line, ground line and clock transmission lines (input line and output line) are formed of the third level aluminum interconnection layer. Therefore, the drive capability of the clock driver can be easily adjusted.

[Eighth embodiment]

Figure 11:
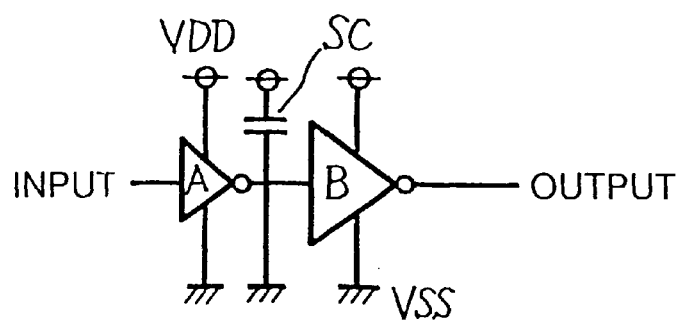
FIG. 11 schematically shows a structure of a clock drive circuit according to an eighth embodiment of the invention.

FIG. 11 schematically shows a structure of a clock drive circuit according to an eighth embodiment of the invention. In the structure shown in FIG. 11, one clock drive circuit (clock driver sub-block) is formed of two inverter circuits A and B. In the clock drive circuit arranging region, a decoupling capacitor SC is disposed between the power supply node and the ground node. By disposing decoupling capacitor SC near the clock drive circuit, generation of power supply noises is prevented during operation of the clock drive circuit.

Figure 12:
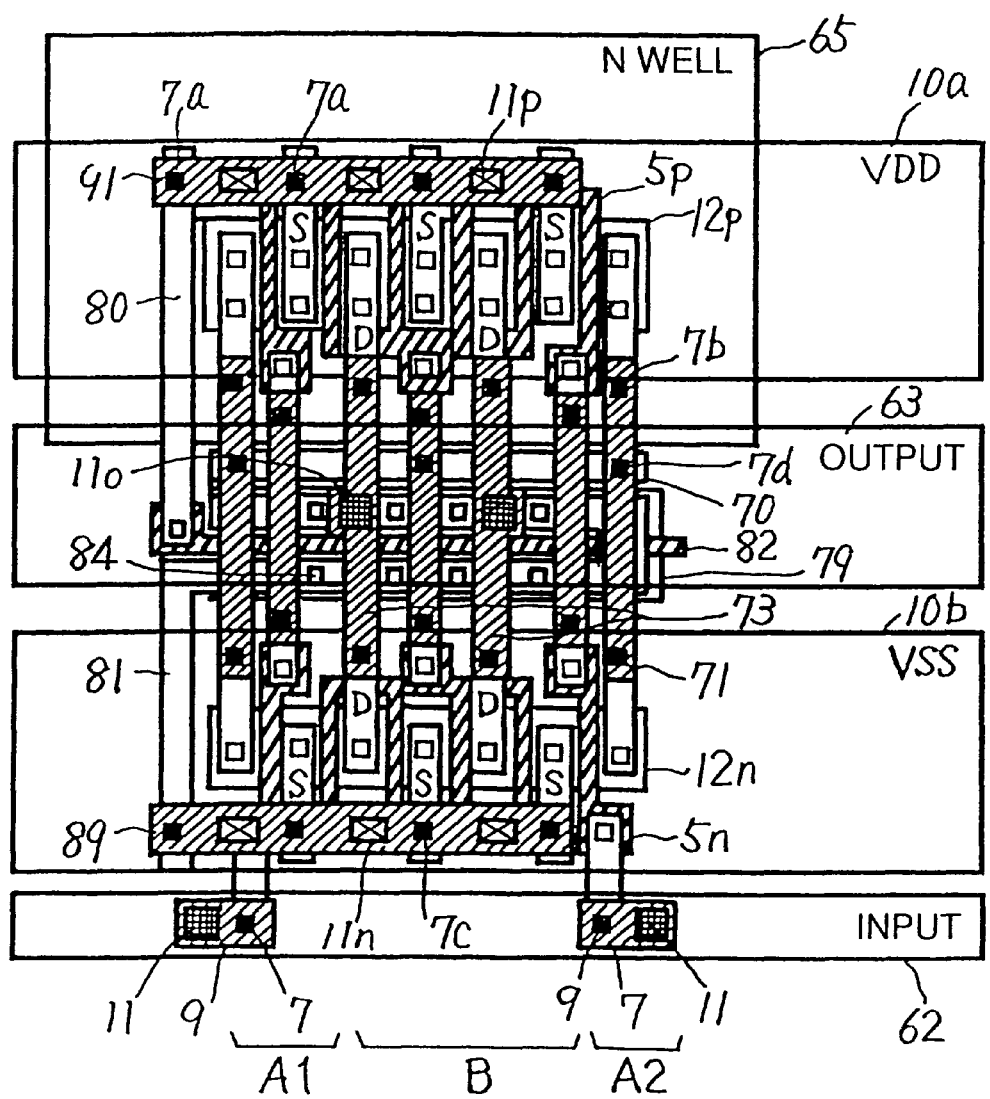
FIG. 12 schematically shows a planar layout of the clock drive circuit according to the eighth embodiment of the invention.

FIG. 12 schematically shows a planar layout of the clock drive circuit according to the eighth embodiment of the invention. In FIG. 12, clock output line 63 transmitting the output clock signal is disposed between power supply line 10a and ground line 10b, and clock input line 62 transmitting the input clock signal is disposed outside ground line 10b. These power supply line 10a, ground line 10b, clock output line 63 and clock input line 62 are formed of the third level aluminum interconnection layer.

An N-well 65 is formed partially overlapping with power supply line 10a in a plan view. N-well 65 is provided for the purpose of forming decoupling capacitor SC, which will be described below, while isolating decoupling capacitor SC from P-channel MOS transistor formation region. In this embodiment, decoupling capacitor SC is formed of MOS capacitors utilizing N-channel MOS transistors.

In N-well 65, a transistor field 12p for forming P-channel MOS transistors is disposed overlapping with power supply line 10a in a plan view. In transistor field 12p, source regions S and drain regions D are arranged alternately to each other. Gate electrode layers 5p are disposed between source regions S and drain regions D. These source regions S are electrically coupled to second level aluminum interconnection layer 9 via the first level aluminum interconnection layer and through-holes 7a. A sub-power supply line 91 formed of the second level aluminum interconnection layer is connected to power supply line 10a at an upper layer via through-holes 11p.

In the arrangement shown in FIG. 12, input inverter circuit A is divided into two CMOS inverter circuits A1 and A2, and output inverter circuit B is disposed between CMOS inverter circuits A1 and A2. In the input CMOS inverter circuit, clock input line 62 is coupled to a lower second level aluminum interconnection layer 9 via through-hole 11. Second level aluminum interconnection layer 9 is coupled to gate electrode layers 5p and 5n of the MOS transistors forming input CMOS inverter circuits A1 and A2 via through-holes 7.

Drain regions of input CMOS inverter circuits A1 and A2 are interconnected via second level aluminum interconnection layer 71, and further are interconnected via through-holes 7d by first level aluminum interconnection line 70 extending horizontally in FIG. 12. First level aluminum interconnection layer (line) 70 is coupled to second level aluminum interconnection layer 73, and is coupled to the gate electrodes of the MOS transistors in output inverter circuit B. Drain regions (D) of output inverter circuit B are interconnected by second level aluminum interconnection line 73, and then are coupled to upper clock output line 63 via a through-hole 11o.

A field region 79 for forming a capacitor is formed under clock output line 63 such that region 79 overlaps with clock output line 63. An impurity region formed in field region 79 is electrically connected via a contact hole 84 to a first level aluminum interconnection layer 81 extending above field region 79 and having a substantially U-shaped form. First level aluminum interconnection layer 81 is connected to a second level aluminum interconnection layer 89 via through-holes. Second level aluminum interconnection layer 89 is connected to source regions (S) of the N-channel MOS transistors forming the clock drive circuit via throughholes 7c, and further is electrically connected via through-holes 11n to ground line 10b at a higher layer.

Across field region 79, there is arranged a gate electrode layer 82 which is formed of, e.g., the first polycrystalline silicon layer and is located between the second level aluminum interconnection layers 81. Gate electrode layer 82 is electrically connected via the contact holes to first level aluminum interconnection layer 80 extending vertically in FIG. 12. First level aluminum interconnection layer 80 is connected to sub-power supply line 91 via through-holes 7a.

In field region 79 formed under clock output line 63, the impurity regions formed on the opposite sides of the gate region are mutually connected by interconnection layer 81, and are connected to ground line 10b. Gate electrode layer 82 is connected to power supply line 10a via interconnection layers 80 and 91. Field region 79 includes N-type impurity regions, and the source and drain of the N-channel MOS transistor are connected to the ground node and the gate thereof is coupled to receive power supply voltage VDD, whereby one MOS capacitor is formed. The one MOS capacitor is formed between power supply line 10a and ground line 10b, and absorbs power supply noises in operation of this clock drive circuit. Since the capacitor is merely formed under clock output line 63, and a region dedicated to arrangement of decoupling capacitor SC is not required. The decoupling capacitor for absorbing noises is merely disposed within the region for forming the clock drive circuit, and therefore the clock drive circuit having a sufficient noise immunity can be achieved without increasing the area.

Figure 13:
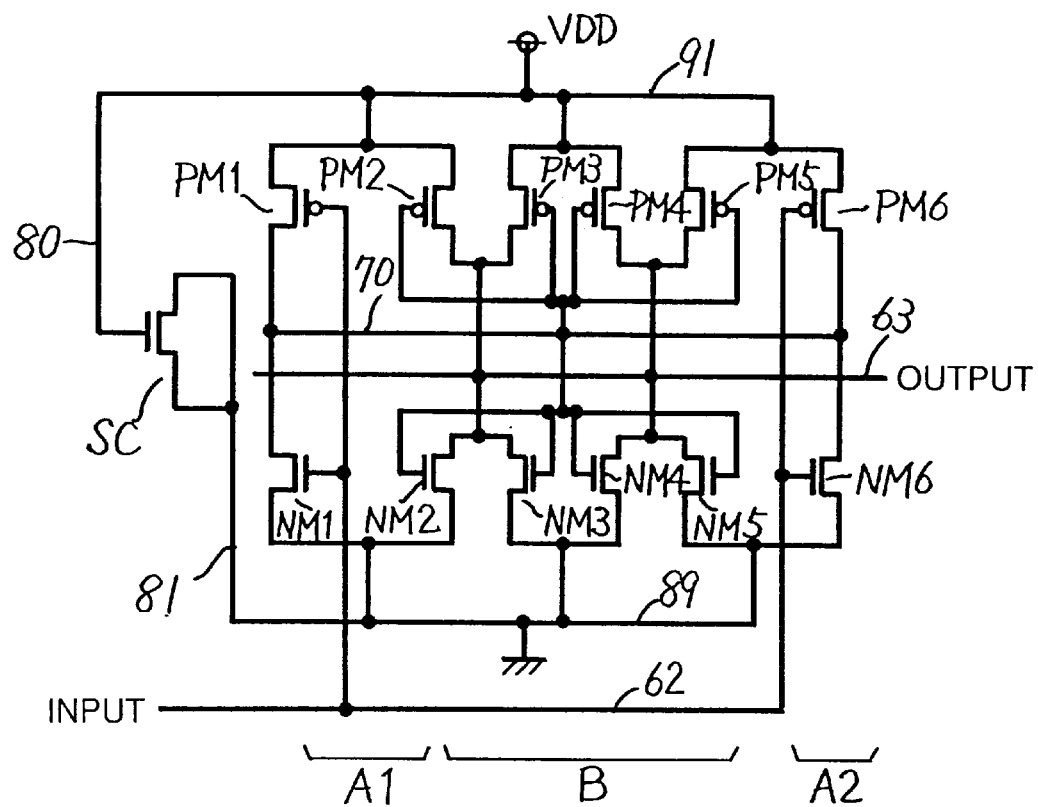
FIG. 13 shows an electrical equivalent circuit of the planar layout shown in FIG. 12.

FIG. 13 shows an electrical equivalent circuit of the clock drive circuit shown in FIG. 12. In FIG. 13, CMOS inverter circuit A1 forming clock drive inverter circuit A includes MOS transistors PM1 and NM1 connected in series between sub-power supply line 91 and sub-ground line 89. Gates of MOS transistors PM1 and NM1 are coupled to clock input line 62. CMOS inverter circuit A2 included in clock drive inverter circuit A likewise includes MOS transistors PM6 and NM6 connected in series between sub-power supply line 91 and sub-ground line 89. MOS transistors PM6 and NM6 commonly receive, on their gates, the input clock signal via clock input line 62.

Output clock drive inverter circuit B includes four P-channel MOS transistors PM2–PM5 as well as four N-channel MOS transistors NM2–NM5. Gates of these MOS transistors PM2–PM5 and NM2–NM5 are interconnected, and are also connected commonly to internal signal line 70. MOS transistors PM2–PM5 and NM2–NM5 are provided with drain contacts, each of which is common to adjacent two MOS transistors. Via these drain contacts, the drains of MOS transistors PM2–PM5 and NM2 NM5 are coupled to output clock line 63.

Sub-power supply line 91 is connected to a gate of decoupling capacitor SC via interconnection 80, and sub-ground line 89 is coupled to source/drain region of decoupling capacitor SC via interconnection 81.

In the structure of the clock drive circuit shown in FIGS. 12 and 13, decoupling capacitor SC may have a channel width nearly equal to the length of N-well 65 shown in FIG. 12. Thus, decoupling capacitor SC is achieved by a MOS capacitor having a larger capacitance without increasing an area in the planar layout.

Since decoupling capacitor SC is provided corresponding to the clock drive circuit (the two inverters), the power supply noises and ground noises can be absorbed efficiently because the clock drive circuit functioning as the noise source is spaced from the decoupling capacitor only by a short distance. Since the decoupling capacitor is disposed regardless of use and non-use of the clock drive circuit, the positions of the decoupling capacitors can be determined without giving consideration to each intended use.

[First Modification]

Figure 14A:
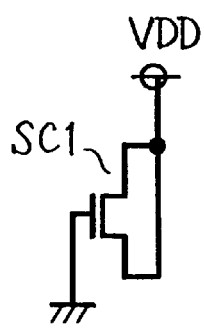
FIGS. 14A, 14B and 14C show modifications of a MOS capacitor in the eighth embodiment of the invention.

FIG. 14A shows a modification of the eighth embodiment of the invention. In FIG. 14A, a decoupling capacitor SC1 is formed of an N-channel MOS transistor having a gate connected to the ground node as well as a drain and a source both coupled to the power supply line. Decoupling capacitor SC1 shown in FIG. 14A is merely different from that shown in FIG. 12 in that interconnection lines 80 and 81 exchange the positions. In this structure, the gate-source capacitance and gate-drain capacitance are sufficiently large, and capacitance SC1 functions as the decoupling capacitor for absorbing noises.

[Second Modification]

Figure 14B:
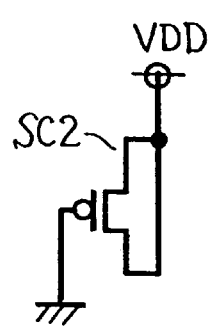

FIG. 14B shows a second modification of the eight embodiments of the invention. A decoupling capacitor SC2 shown in FIG. 14B is formed of a P-channel MOS transistor having a gate connected to the ground line as well as a source and a drain both coupled to the power supply line. In this structure, decoupling capacitor SC2 is always on to form a channel region so that the decoupling capacitor having a large capacitance value can be achieved.

Decoupling capacitor SC2 shown in FIG. 14B is formed of a P-channel MOS transistor within field region 79, and N-well 65 is expanded to surround field region 79. The structure wherein the gate is connected to the ground line, and the source and drain are connected to the power supply line can be achieved by exchanging interconnection lines 80 and 81 in the layout shown in FIG. 12.

[Third Modification]

Figure 14C:
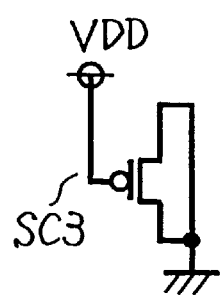

FIG. 14C shows a third modification of the decoupling capacitor of the eighth embodiment of the invention. A decoupling capacitor SC3 shown in FIG. 14C is formed of a P-channel MOS transistor having a gate connected to the power supply line as well as a source and a drain both connected to the ground line. Decoupling capacitor SC3 shown in FIG. 14C is formed of the MOS transistor which is always off, and the gate-drain capacitance and source-gate capacitance are utilized. Decoupling capacitor SC3 shown in FIG. 14C is implemented by expanding N-well 65 to surround field region 79 in the layout shown in FIG. 12, and by providing a P-type impurity region as an impurity region in field region 79.

The MOS capacitors shown in FIGS. 13 and 14A–14C may be used individually as the decoupling capacitors, respectively, or may be used in combination to form a decoupling capacitor.

According to the eight embodiment of the invention, as described above, the MOS capacitor is disposed between P- and N-channel MOS transistors forming the clock drive circuit. Therefore, it is not necessary to provide a dedicated capacitor region, and it is possible to implement the decoupling capacitor which can efficiently absorb the power supply noises and ground noises of the clock drive circuit. Since the decoupling capacitors are formed of MOS transistors, the decoupling capacitor can be formed in the same manufacturing steps as those of forming the P- and N-channel MOS transistors, and thus can be manufactured without increasing the number of manufacturing steps.

[Ninth Embodiment]

Figure 15:
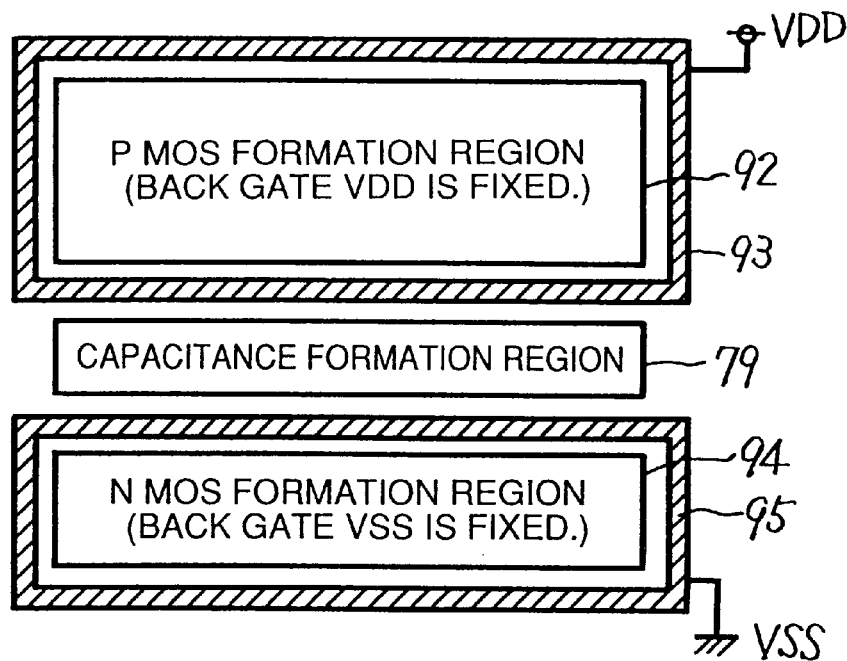
FIG. 15 schematically shows a structure of a main portion of a semiconductor circuit device according to a ninth embodiment of the invention.

FIG. 15 schematically shows a structure of a main portion of a semiconductor circuit device according to a ninth embodiment of the invention. In the structure shown in FIG. 15, a guard ring 93 is provided surrounding a PMOS formation region 92 in which P-channel MOS transistors are formed. Guard ring 93 is fixed at power supply voltage VDD level, and fixes the back gate of PMOS transistor in PMOS formation region 92 at power supply voltage VDD level. A guard ring 95 is also provided surrounding an NMOS formation region 94 in which N-channel MOS transistors are formed. Guard ring 95 is fixed at ground voltage VSS level, and fixes the back gates of NMOS transistors in NMOS formation region 94 at ground voltage VSS level. Capacitance formation region 79 in which a decoupling capacitor is formed is disposed between PMOS and NMOS formation regions 92 and 94.

PMOS and NMOS formation regions 92 and 94 may include clock driver sub-blocks, or guard ring may be provided in a predetermined region unit (e.g., for each inverter) within one large clock driver. A plurality of P-channel MOS transistors are formed in PMOS formation region 92, and a plurality of N-channel MOS transistors are formed in NMOS formation region 94. When these MOS transistors operate, noises may occur in the substrate region via source/drain function joint capacitance, and may be transmitted to another circuit. Owing to provision of guard rings 93 and 95 as a back gate bias application region, it is possible to prevent transmission of noises during the operation of the clock driver (clock drive circuit) to another circuit via the substrate region. Thereby, adverse effects by the operation of the clock driver (clock drive circuit) can be prevented.

In the structure shown in FIG. 15, PMOS and NMOS formation regions 92 and 94 are provided with guard rings 93 and 95, respectively. Only one of PMOS and NMOS formation regions 92 and 94 may be provided with the guard ring. Guard ring 93 is formed of, e.g., a heavily doped N-type impurity region, and fixes the back gate (substrate) of a P-channel MOS transistor formed in PMOS formation region 92 at power supply voltage VDD level. Guard ring 95 is formed of a heavily doped P-type impurity region, and fixes the back gate of N-channel MOS transistor formed in NMOS formation region 94 at ground voltage VSS level. Guard rings 93 and 95 may be isolated from those for the other clock drive circuits, e.g., by field insulating films. Also, an isolation structure (PN junction isolation) of a so-called trench structure may be employed for isolating the guard rings for the respective clock drive circuits.

The substrate voltages of the MOS transistors formed in PMOS and NMOS formation regions 92 and 94 can be held at a constant level, and it is possible to prevent adverse effects due to substrate noises on another circuit during the operation of the clock drive circuit.

[Tenth Embodiment]

Figure 16:
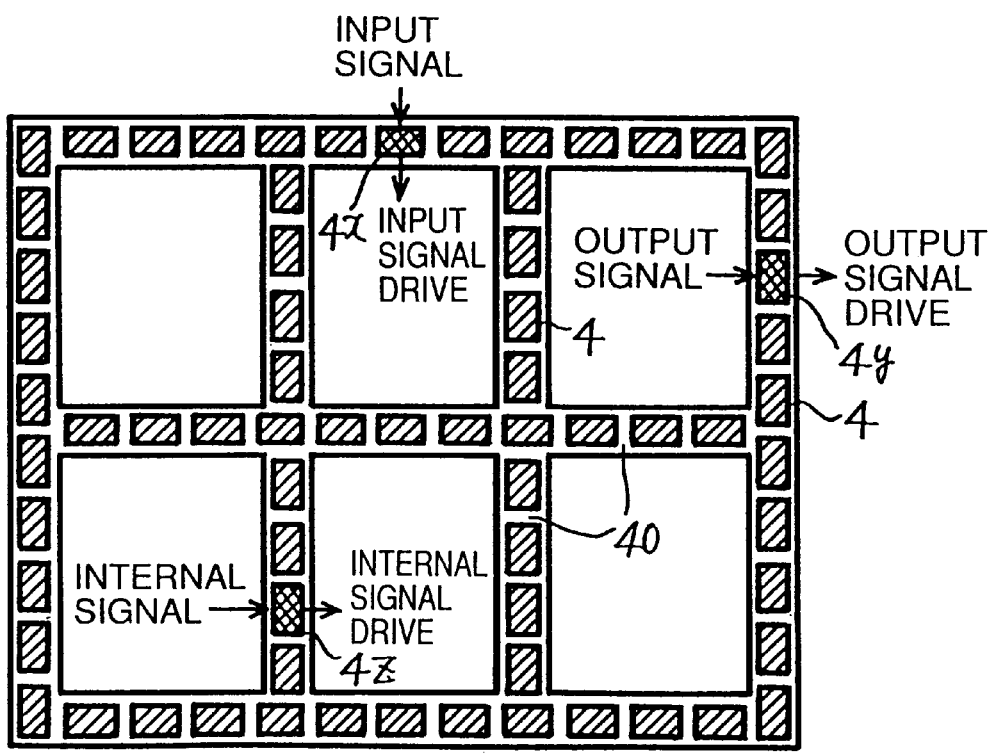
FIG. 16 schematically shows a whole structure of a semiconductor circuit device according to a tenth embodiment of the invention.
Figure 17:
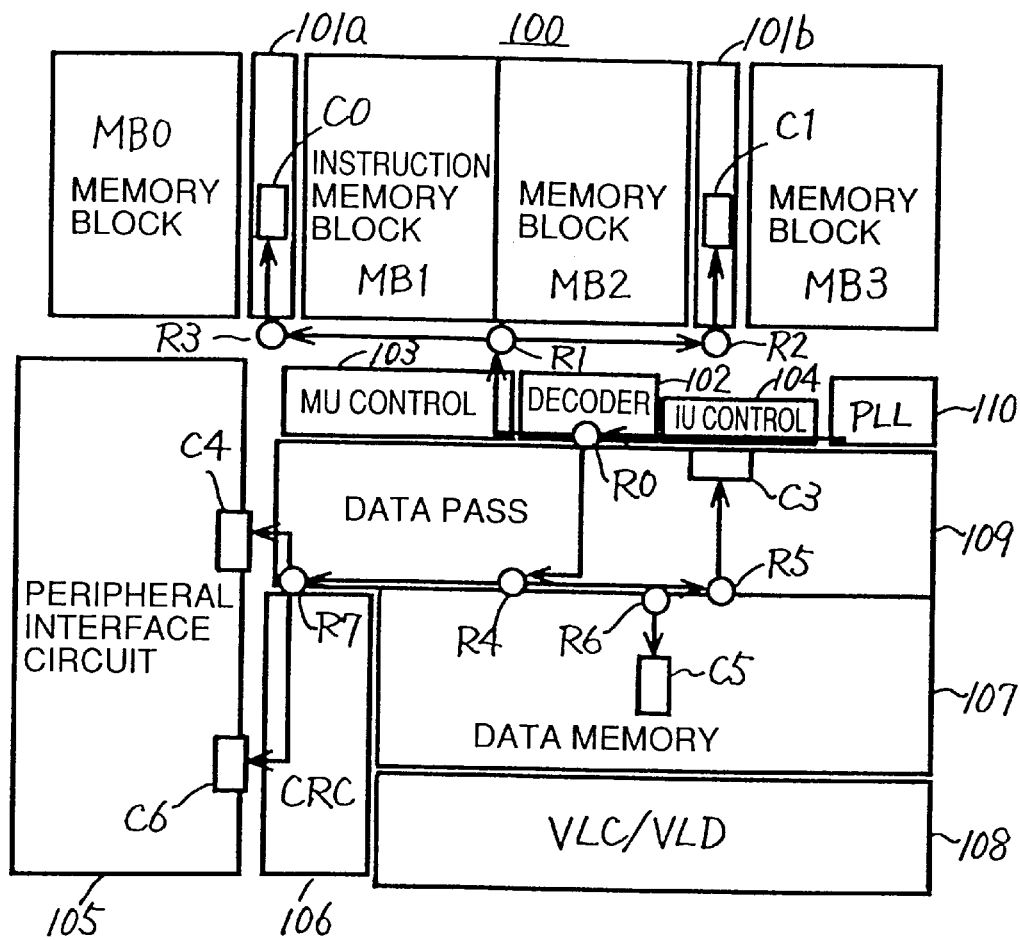
FIG. 17 schematically shows an arrangement of clock drivers in a conventional semiconductor circuit device.
Figure 18:
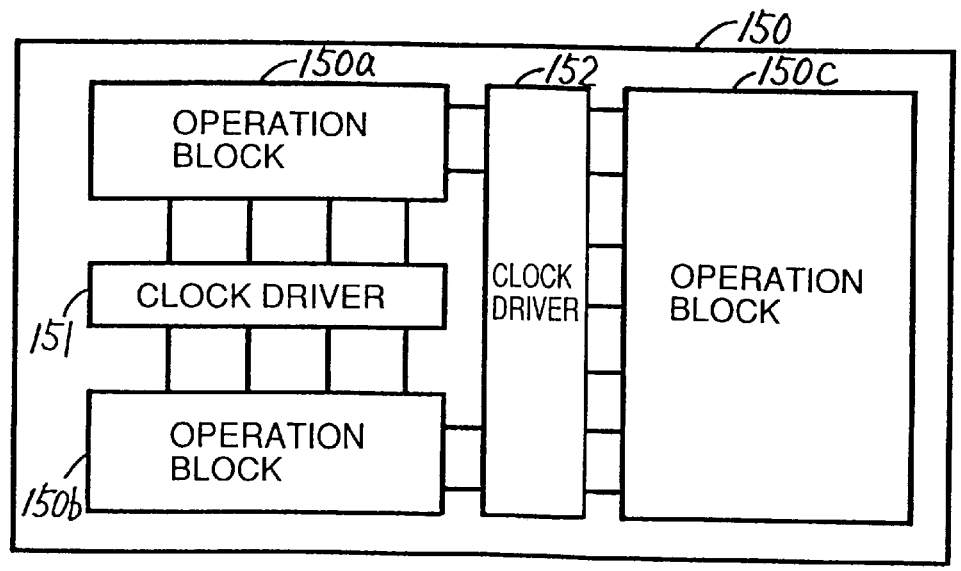
FIG. 18 schematically shows another arrangement of the clock drivers in the conventional semiconductor circuit device.

FIG. 16 schematically shows a structure of a main portion of a semiconductor circuit device according to a tenth embodiment of the invention. In FIG. 16, a clock driver disposed under the ring interconnection line and meshed-shape interconnection line is divided into clock driver sub-blocks 4. Feed-through regions 40 are formed between clock driver sub-blocks 4. Among clock driver sub-blocks 4, there are nonuse clock driver sub-blocks 4x, 4y and 4z containing non-use clock drivers, which are not used for transmitting the clock signal. These non-use clock driver sub-blocks have the inputs fixed at the predetermined voltage level as shown in FIG. 10, and also have the outputs in the open state. In this embodiment, these non-use clock driver sub-blocks are utilized as drive circuits for driving some other signals. For this end, the input of a non-use clock driver sub-block is connected in the feed-through region to another signal line, and the output thereof is connected to another circuit through the feed-through region. Connection between the clock driver sub-block and another circuit is made via an interconnection line at a layer lower than the power supply line and ground line, and therefore may be made at an appropriate position within sub-block 4 without passing through dedicated feed-through region 40.

FIG. 16 shows, as typical examples of the non-use clock driver sub-blocks, input signal drive circuit 4x for driving an externally supplied input signal for transmission to a circuit, an output signal drive circuit 4y for externally outputting a signal indicative of the result of processing by an internal circuit, and an internal signal drive circuit 4z for driving signals received from an internal circuit to another internal circuit in the semiconductor circuit device.

Even in the case where a region for disposing, e.g., a buffer circuit for signal driving is not present, the non-use clock drive circuit in an appropriate position can be utilized as the buffer circuit for driving another signal because sub-blocks 4 have the drive circuits of the same layout, and are dispersed over the rectangular semiconductor substrate region. Thus, it is not necessary to provide a drive circuit dedicated to driving of a signal other than the clock signal, and therefore a layout area is reduced. In the case where a buffer circuit is employed but has an insufficient drive capability, a non-use clock drive circuit can be utilized for supplementing the drive capability. The drive capability can be adjusted even after determination of the layout of internal circuits by using the non-use clock drive circuits. Since the non-use circuits are reduced in number, the circuit utilizing efficiency is improved.

[Other Applications]

The semiconductor circuit device is merely required to include the internal circuit which operates in synchronization with the clock signal. If the design is made based on a unit of a macro, e.g., in a hierarchical design approach, the clock driver formation regions may be disposed along macro boundary regions.

According to the invention, since the clock driver formation regions overlapping with the ring and meshed-shape interconnection lines are provided for both the ring and meshed-shape interconnection lines, a special region dedicated to provision of the clock driver is not required, and the layout area is reduced. Since the clock drivers are dispersed on the semiconductor substrate region, the clock signal can be taken out from an appropriate region. Since the clock signal lines have a structure similar to those of the meshed-shape interconnection line and ring interconnection line, the clock signal lines can be enhanced, and the clock skew can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a ring interconnection line disposed along a periphery of a rectangular semiconductor substrate region in a form of a loop, for transmitting a predetermined one of a voltage and a signal;
   a meshed-shape interconnection line extending over a region surrounded by said ring interconnection line, and connected to said ring interconnection line; and
   a clock driver formation region arranged overlapping with said ring interconnection line and said meshed-shape interconnection line in a plan view, a clock driver formed in said clock driver formation region transmitting a clock signal determining an operation timing of a circuit formed on said semiconductor substrate region.

2. The semiconductor integrated circuit device according to claim 1, wherein said ring interconnection line and said meshed-shape interconnection line include a power supply line and a ground line transmitting a power supply voltage and a ground voltage, respectively, said power supply line and said ground line are arranged parallel to each other, and the clock driver formed in said clock driver formation region is substantially covered, in a plan view, with said power supply line and said ground line except for a region between said power supply line and said ground line.

3. The semiconductor integrated circuit device according to claim 2, wherein a clock signal line transmitting an output signal of said clock driver is disposed between said power supply line and said ground line.

4. The semiconductor integrated circuit device according to claim 1, wherein said clock driver formation region is divided into sub-clock driver formation regions by feed-through regions for arranging interconnection lines extending across said ring interconnection line and said meshed-shape interconnection line.

5. The semiconductor integrated circuit device according to claim 1, wherein the clock driver formed in said clock driver formation region includes two inverters arranged in input and output stages, respectively, and the inverter in the input stage includes first and second inverter circuits disposed on opposite sides of the inverter in the output stage, and operating in parallel with each other.

6. The semiconductor integrated circuit device according to claim 1, wherein the clock driver formed in said clock driver formation region includes two inverters arranged in input and output stages, respectively, and the inverter in the output stage includes first and second inverter circuits disposed on opposite sides of the inverter in the input stage and operating in parallel with each other.

7. The semiconductor integrated circuit device according to claim 1, wherein the clock driver disposed in said clock driver formation region includes an insulated gate field effect transistor having a control gate formed into a concave and convex form in a planar layout.

8. The semiconductor integrated circuit device according to claim 7, wherein said insulated gate field effect transistor has a drain region connected to an output node of said clock driver, and a distance between said control gate and a contact hole for making an electrical contact between said drain region and an interconnection line forming said output node is set to a minimum design size value.

9. The semiconductor integrated circuit device according to claim 4, wherein said sub-clock driver regions have clock drivers of a same layout formed therein, and a non-use clock driver has an input node coupled to a fixed voltage transmitting line included in the ring and meshed-shape interconnection lines, and an output node set to an open state.

10. The semiconductor integrated circuit device according to claim 9, wherein said non-use clock driver and a clock driver to be used are different from each other in position of through-holes of input node and output node in a plan view.

11. The semiconductor integrated circuit device according to claim 1, wherein the clock driver formed in said clock driver formation region includes a P-channel insulated gate field effect transistor and an N-channel insulated gate field effect transistor; and said semiconductor integrated circuit device further comprises a capacitor formed of an insulated gate field effect transistor disposed between the P- and N-channel insulated gate field effect transistor forming regions, and having a control gate coupled to a first fixed voltage transmission line included in the ring and meshed-shape interconnection lines and transmitting a first fixed voltage as well as source and drain regions coupled to a second fixed voltage transmission line included in said ring and meshed-shape interconnection lines and transmitting a second fixed voltage.

12. The semiconductor integrated circuit device according to claim 1, wherein the clock driver formed in said clock driver formation region includes an insulated gate field effect transistor having a source and a back gate coupled to a fixed voltage transmission line for transmitting a fixed voltage included in the ring and meshed-shape interconnection lines; and said semiconductor integrated circuit device further comprises a guard ring formed surrounding a back gate formation region for forming the back gate of said insulated gate field effect transistor, and receiving said fixed voltage.

13. The semiconductor integrated circuit device according to claim 4, wherein said sub-clock driver regions have drivers of a same layout formed therein, and said sub-clock driver regions include a clock driver region having a clock driver for driving said clock signal formed therein and a driver region having a driver for driving a signal other than said clock signal formed therein.

* * * * *